United States Patent

Swann

Patent Number: 5,536,941
Date of Patent: Jul. 16, 1996

[54] ROTATABLE WIDE ANGLE CAMERA AND PRISM ASSEMBLY FOR ELECTRON MICROSCOPES

[75] Inventor: Peter R. Swann, St. Johns, Antigua/Barbuda

[73] Assignee: Gatan, Inc., Pleasanton, Calif.

[21] Appl. No.: 392,242

[22] Filed: Feb. 22, 1995

[51] Int. Cl.[6] .................................................. H01J 37/244
[52] U.S. Cl. .......................................... 250/311; 250/397
[58] Field of Search ..................................... 250/306, 307, 250/311, 397

[56] References Cited

U.S. PATENT DOCUMENTS

| | | | |
|---|---|---|---|
| 4,739,399 | 4/1988 | Swann et al. | 250/311 |
| 5,013,915 | 5/1991 | Isakazawa et al. | 250/311 |
| 5,065,029 | 11/1991 | Krivanek | 250/441.1 |

*Primary Examiner*—Bruce C. Anderson
*Attorney, Agent, or Firm*—Killworth, Gottman, Hagan & Schaeff

[57] ABSTRACT

An apparatus for recording electron images and diffraction patterns which can be automatically controlled via a computer, has improved precision, and has greater flexibility in acquiring and displaying specimen images is provided. The apparatus includes an electron microscope having a projection chamber, an electron scintillator in the projection chamber for converting a projected electron image into a light image, and a camera positioned adjacent to the projection chamber for acquiring the light image. The camera is rotatable about its optical (horizontal) axis so that desired features of the acquired image may be brought into alignment with the display device used to view them, such as for example, a CRT screen. By positioning the camera outside of the vacuum of the electron microscope projection chamber, problems associated with prior internally-mounted devices are avoided and the camera may be readily manually or automatically adjusted.

8 Claims, 3 Drawing Sheets

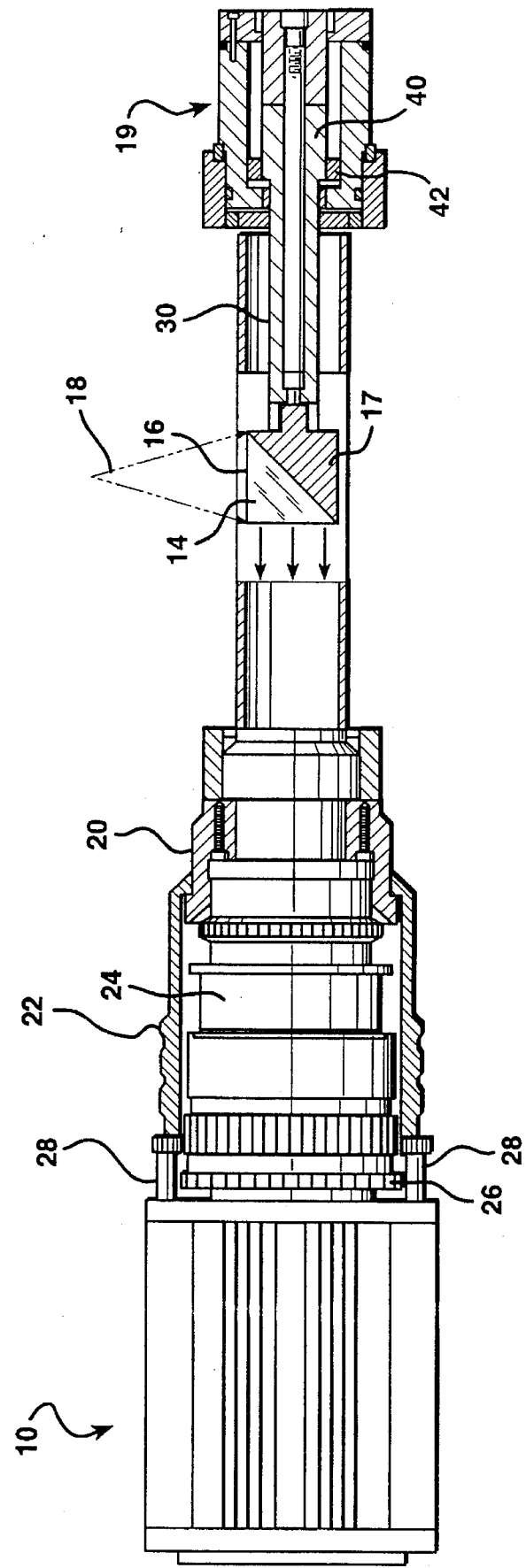

ROTATABLE WIDE ANGLE CAMERA AND PRISM ASSEMBLY FOR ELECTRON MICROSCOPES

BACKGROUND OF THE INVENTION

This invention relates to a camera and prism assembly used for viewing images of specimens in an electron microscope, and more particularly to a camera which is mounted externally of the microscope and which can be readily adjusted about a horizontal axis for aligining such images on a viewing device.

Transmission electron microscopes use a beam of accelerated electrons which pass through a specimen to provide an electron image and/or diffraction pattern of the specimen. To provide a record of these images and/or diffraction patterns, the electrons have been converted into light images using scintillator materials (e.g., phosphors), and the light images and/or patterns are then captured by a camera. While photographic film has long been used, charge-coupled devices (CCD) of the type originally developed for astronomy to read light images into a computer have found increasing use in this field. Such CCD cameras offer excellent resolution, sensitivity, linearity, are reusable, and make the image available for viewing within seconds of recording.

With the advent of digital image processing in transmission electron microscopy, such CCD cameras have been used to transfer images directly from the microscope to a computer. Typically, the electron image is converted to a light image by means of a scintillator such as a phosphor screen mounted inside the transmission electron microscope. The light image is then transferred to a CCD camera, also located inside of the microscope, using a lens or fiber optic coupling. The image collected by the camera is then digitized electronically and stored in a computer where it be manipulated and viewed with the aid of appropriate software.

In order to acquire an electron image, a scintillator such as a phosphor screen, must first be inserted into the path of the image. For viewing a wide image area, the phosphor screen is positioned above the normal fluorescent viewing screen and close to the microscope projector lens. The phosphor screen must also be retractable so that it does not shadow other devices, such as an electron spectrometer or a film camera, that are typically mounted further down the transmission electron microscope column.

One problem which has affected prior art systems is that the mechanism which inserts and retracts the phosphor screen must operate smoothly so that it does not transmit vibrations to the microscope which could reduce image resolution. Further, after each cycling of the screen between an inserted and a retracted position, the mechanism must be able to return the phosphor screen precisely (to within one image pixel of resolution at the CCD camera) to its previous location. Otherwise, a new reference image must be acquired with each cycle so that computer-controlled gain normalization can be carried out on the image.

Prior art devices which use mechanical screw drive mechanisms have reproducibility problems because of the back lash and dead travel inherent in these mechanisms. Further, such prior mechanisms could not be interfaced with any automatic control apparatus as there was no ability to predict or measure the amount of back lash compensation needed each time the phosphor screen was moved.

Current CCD cameras are typically positioned in a fixed location, for example, mounted on the base of the electron microscope projection chamber. Such a fixed location sacrifices flexibility, as trade-offs must be made between enhancing resolution of the acquired image and maximizing light collection efficiency for faint images. Further, the fixed location of prior art CCD cameras restricts how the captured image may be viewed by the user.

Further, mounting the camera in a vacuum within the electron microscope presents problems of maintaining low operating temperatures (e.g., about −30° C.) and the degree of vacuum over time. Krivanek, U.S. Pat. No. 5,065,029, addresses that problem by providing a vacuum valve which opens and closes to separate the camera from the electron microscope chamber. In another embodiment, the patentee teaches a movable camera mounted on a pneumatically-operated piston which can be inserted into the electron microscope chamber and then withdrawn and sealed off. However, the camera still returns to the same location after each cycle and cannot be adjusted to a different location.

Accordingly, the need exists in this art for a camera and viewing system for an electron microscope which provides for better automatic control, improved precision, and greater flexibility in acquiring and displaying specimen images.

SUMMARY OF THE INVENTION

The present invention meets that need by providing an apparatus for recording electron images and diffraction patterns which can be automatically controlled via a computer, has improved precision, and has greater flexibility in acquiring and displaying specimen images. Further, by positioning the apparatus elements near the projector lens of an electron microscope, a wide image area may be acquired and viewed.

In accordance with one aspect of the present invention, the apparatus includes an electron microscope having a projection chamber, an electron scintillator in the projection chamber for converting a projected electron image into a light image, and a camera positioned adjacent to the projection chamber for acquiring the light image. The camera is rotatable about its optical (horizontal) axis so that features of the acquired image may be brought into alignment with the display device used to view them, such as for example, a CRT screen. By positioning the camera outside of the vacuum of the electron microscope projection chamber, problems associated with prior internally-mounted devices are avoided, and the camera may be readily manually or automatically adjusted.

To provide additional flexibility in the system, the camera is repositionable at predetermined distances from the vertical axis of the projection chamber. This permits the camera to be positioned optimally for image resolution or efficient light capture in those circumstances where the image of interest is faint. To accomplish this, the camera includes a plurality of sets of interchangeable mounts, with each of the sets having different stand-off lengths.

The scintillator in the apparatus operates to convert the electron image or diffraction pattern into a light image. The scintillator is mounted on or adhered to the top surface of an optical prism the purpose of which is to reflect the light image transmitted through the scintillator from the horizontal plane at which the electron image is incident thereon to a vertical plane. Such an optical prism may be manufactured of glass or other material.

For even greater flexibility in the apparatus, the scintillator and optical prism are movable from a first position in the path of the projected electron image to a second position out of the path of the projected electron image. In this manner, the scintillator will not shadow other devices and will permit other operations to be carried out in the projection chamber. To provide the smooth, vibration-free movement of the scintillator into and out of the path of the projected image, the scintillator may be carried on the end of a pneumatically-operated piston. movement of the pneumatic piston into and out of the projected image path is controlled by a three-way pneumatic valve and/or a three-way solenoid valve. For automatic control, all of the apparatus elements may be placed under the control of a programmed computer which can move the scintillator into position, rotate the camera to align the image, focus the camera, and process the images received from the camera.

Accordingly, it is a feature of the present invention to provide an apparatus for recording electron images and diffraction patterns which can be automatically controlled via a computer, has improved precision, and has greater flexibility in acquiring and displaying specimen images. It is a further feature of the present invention that a wide image area may be viewed. These, and other features and advantages of the present invention, will become apparent from the following detailed description, the accompanying drawings, and the appended claims.

BRIEF DESCRIPTION OF THE DRAWINGS

FIG. 3 is a side view, partially in section, of the camera and prism assembly of the present invention.

DETAILED DESCRIPTION OF THE PREFERRED EMBODIMENT

Figure 1:
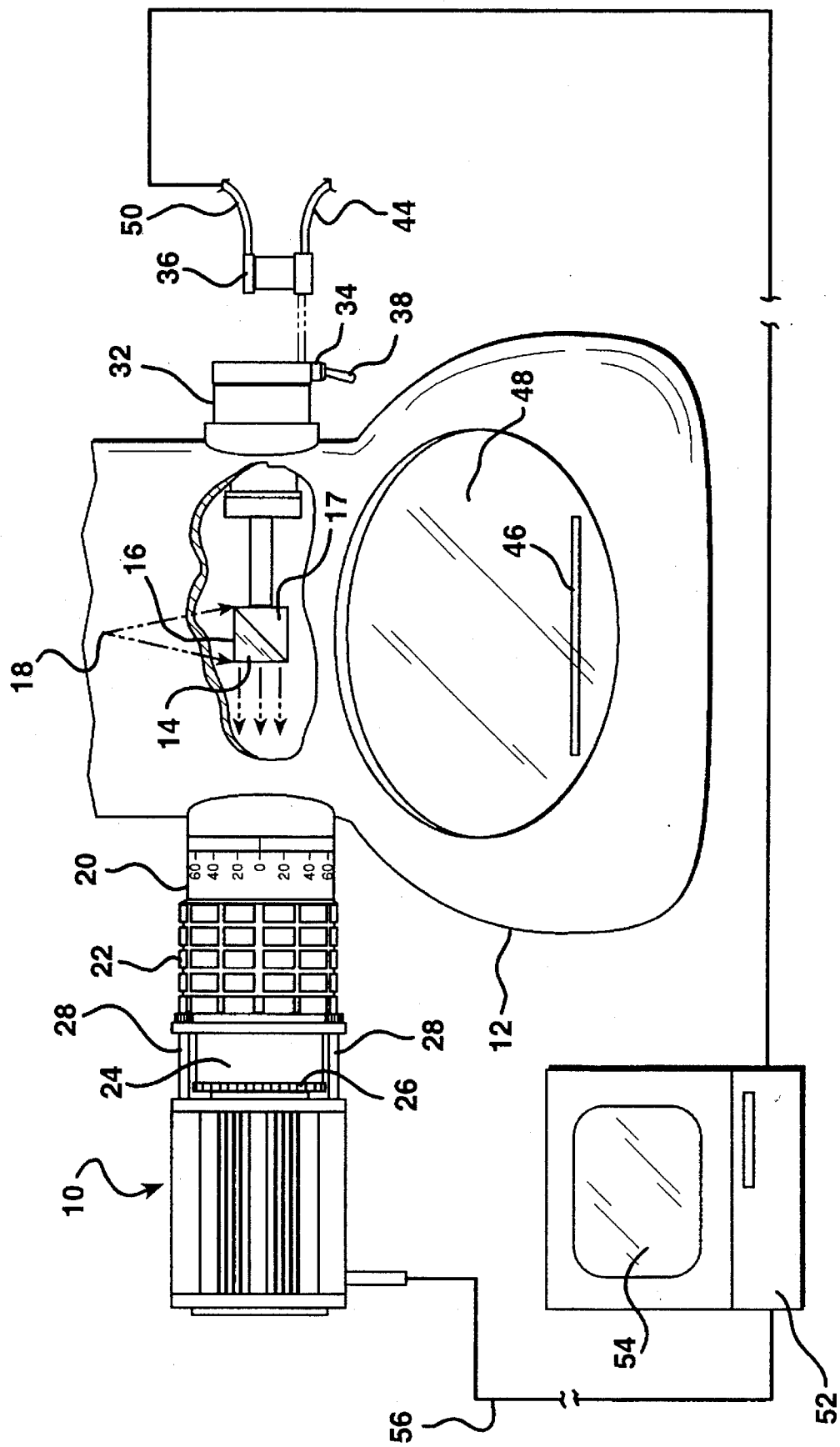
FIG. 1 is a schematic view of the apparatus of the present invention illustrating the scintillator extended into the path of the projected electron image.

Referring now to FIG. 1, camera 10 is mounted externally onto the side of an electron microscope projection chamber 12. In this way, the camera is not subject to the vacuum present in the interior of the microscope. Additionally, camera 10 is shown positioned on projection chamber 12 to acquire and view a wide image area. Mounted within projection chamber 12 is an electron scintillator such as a phosphor 14 coated or otherwise applied onto the surface of glass prism 16. Glass prism 16 is supported by and adhered to a prism-shaped block of metal 17 such as aluminum. There are many commercially available phosphors which are suitable as scintillators for use in the present invention. Such phosphors include those which are available as particulate powders which can be coated onto the surface of the prism.

As shown, an electron image 18 from an electron beam which has passed through a specimen (not shown) impinges on phosphor 14 where it is converted into a light image. The light image, which is in a horizontal plane, is redirected by prism 16 in the direction of the arrows into a vertical plane where it is captured by camera 10.

Camera 10 may be any type of light camera which uses a lens system. For example, camera 10 may comprise a two-dimensional charge-coupled device (CCD) sensor. CCD sensors are commercially available up to 2,048×2,048 pixels in size from several manufacturers including Scientific Imaging Technologies (SITe), Thomson CSF, and English Electric Valve Ltd.. A suitable CCD for use in the present invention is a 1,024×1,024 pixel device available from Scientific Imaging Technologies (SITe). For example, camera 10 may be a Megaplus Camera, Model 1.6, commercially available from Eastman Kodak Company, San Diego, Calif.

As best shown in FIGS. 1 and 3, camera 10 is mounted on a bearing 20 in such a way that it can be rotated about its horizontal axis by means of knurled knob 22. Angle markings such as those shown in FIG. 1 may be used to provide the operator of the camera a convenient indication of how many degrees the camera has been rotated about its horizontal axis. As described above, glass prism 16 rotates the image from a horizontal plane to a vertical plane. The image is then focussed onto the camera sensor by lens 24. Lens 24 may be adjusted as is conventional in the art by a focussing ring 26 to sharpen the image.

The captured image is then sent via electrical connection 56 to computer 52 where it is displayed on a suitable viewing device such as CRT screen 54. Where the captured image is not aligned for easy viewing by the operator, the operator may then use knob 22 to rotate camera 10 about its horizontal axis to bring the image into a desired alignment. As will be apparent to those skilled in this art, knob 22 and the mechanism for rotating camera 10 may be readily adapted for motorized operation.

To increase the flexibility of the apparatus, camera 10 may be set at several different predetermined standard distances from the vertical axis of projection chamber 12. This is accomplished through the use of sets of stand-off posts or camera support rods 28, illustrated in a typical arrangement of four posts located substantially equidistantly about the periphery of the camera body. Posts 28 are mounted on bearing 20 and will move with the camera as it is rotated about its horizontal axis. Two different exemplary stand-off lengths are shown in FIGS. 1 and 3, respectively. The posts may include threads so that they may be screwed into position. Stand-off posts 28 permit camera 10 to be positioned optimally for image resolution or efficient light capture in those circumstances where the image of interest is faint.

The flexibility of the apparatus is also evident from the capability to move prism 16, and phosphor scintillator 14, into and out of the path of electron image 18 in a reproducible manner. As shown, prism 16 and block 17 are mounted on a piston rod 30 which is in turn connected to a pneumatically-operated piston assembly 32. Operation of the piston rod is accomplished through a three-way pneumatic valve 34 and/or a three-way solenoid actuated valve 36, both of which are commercially available and whose construction is well known.

When toggle 38 of pneumatic valve 34 is thrown towards the electron microscope as shown in FIG. 1, compressed air in piston assembly 32 is vented to atmosphere. Because the electron microscope is under vacuum, piston rod 30 and prism 16 are drawn into projection chamber 12 until a predetermined stopping point is reached. This configuration of the apparatus is shown in FIGS. 1 and 3. As shown in FIG. 3, for example, the stopping point of the inward movement of the piston is reached when shoulder 40 on rod 30 contacts extending flange 42 in piston assembly 32.

Figure 2:
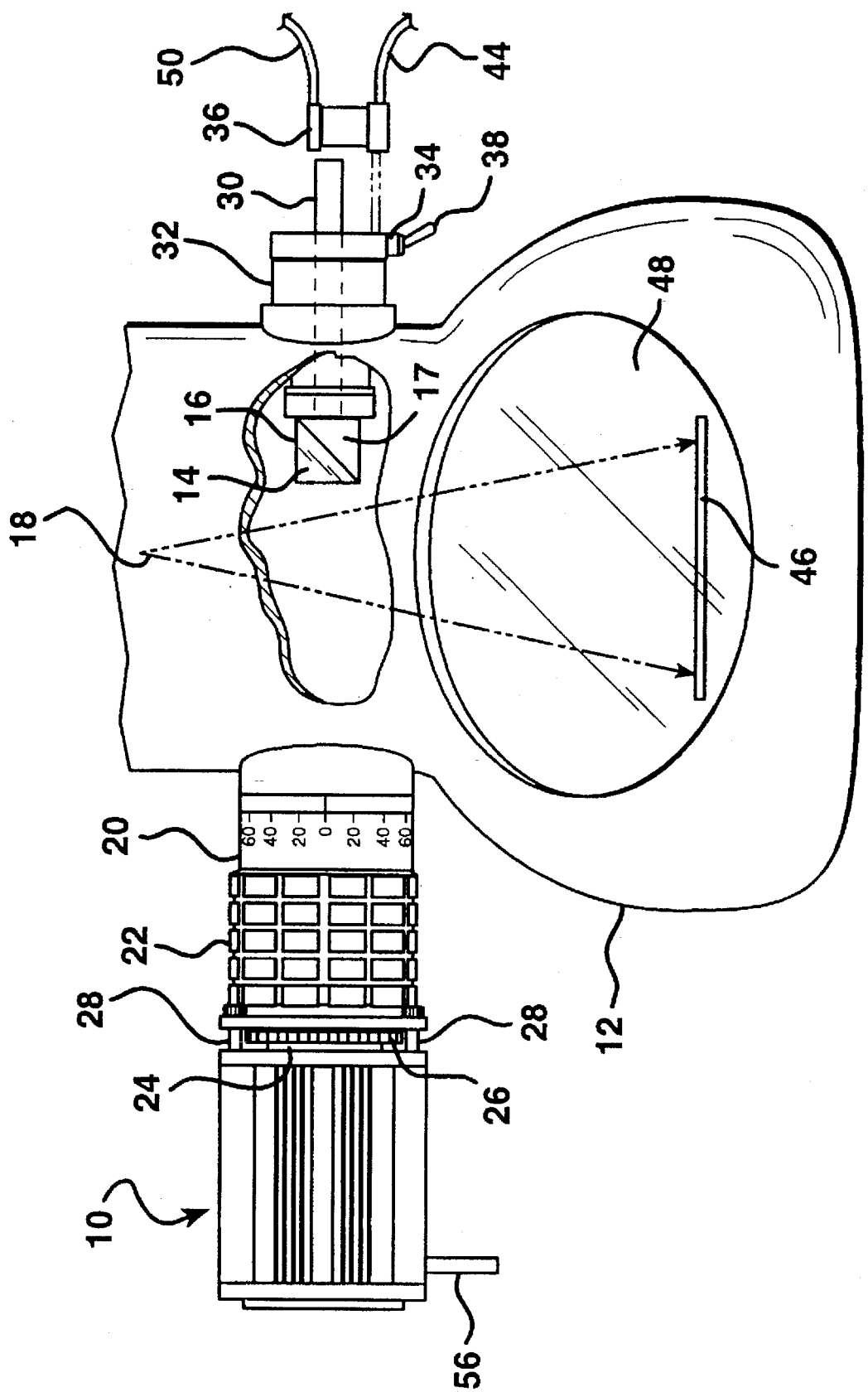
FIG. 2 is also a schematic view of the apparatus, but with the scintillator withdrawn from the image path, and the image projected onto a viewing screen.

When toggle 38 is thrown in the opposite direction as shown in FIG. 2, three-way pneumatic valve. 34 causes compressed air from a source (not shown) to enter piston assembly 32 through hose 44. The compressed air expands into the sealed annular space 46 surrounding piston rod 30 and forces piston rod 30 to move away from projection chamber 12 to the position shown in FIG. 2. In this retracted position, electron image 18 is not intercepted, but instead passes further into chamber 12 to form a large area image on viewing screen 46. As shown, the image on viewing screen 46 may be viewed by the operator of the apparatus through viewing window 48.

Pneumatic operation of piston rod 30 minimizes vibrations in projection chamber 12 which could adversely affect the quality and resolution of the image captured by camera 10. Additionally, such pneumatic operation is reproducible to within a single pixel so that a new reference image need not be acquired after each operating cycle of the piston. Pneumatic operation avoids the backlash and dead space problems of prior mechanical screw mechanisms.

The retraction and insertion of piston rod 30 may also be accomplished through the operation of solenoid valve 36 which is connected in series with pneumatic valve 34. Thus, solenoid valve 36 may be operated either to vent compressed air to the atmosphere to cause piston rod 30 to be inserted into chamber 12, or it may be operated to cause compressed air to flow into piston assembly 32 and cause piston rod 30 to retract. Although the functions of the two valves are substantially the same, pneumatic valve 34 is actuated manually by the operator of the apparatus while solenoid valve 36 is actuated electrically through line 50 by a computer command from computer 52.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. An apparatus for recording images and diffraction patterns produced by an electron microscope comprising:

a) an electron microscope having a projection chamber;

b) an electron scintillator in said projection chamber for converting a projected electron image into a light image; and c) a camera positioned adjacent to said projection chamber for acquiring said light image, said camera being rotatable about its optical axis.

2. An apparatus as claimed in claim 1 in which said camera is repositionable at predetermined distances from the vertical axis of said projection chamber.

3. An apparatus as claimed in claim 1 in which said scintillator is mounted on an optical prism which reflects said light image from a horizontal to a vertical plane.

4. An apparatus as claimed in claim 1 in which said scintillator is movable from a first position in the path of said projected electron image to a second position out of the path of said projected electron image.

5. An apparatus as claimed in claim 4 in which said scintillator is carried on a pneumatic piston.

6. An apparatus as claimed in claim 5 in which the movement of said pneumatic piston is controlled by a three-way pneumatic valve.

7. An apparatus as claimed in claim 5 in which the movement of said pneumatic piston is controlled by a three-way solenoid valve.

8. An apparatus for recording images and diffraction patterns produced by an electron microscope comprising:

a) an electron microscope having a projection chamber;

b) an electron scintillator in said projection chamber for converting a projected electron image into a light image; and c) a camera positioned adjacent to said projection chamber for acquiring said light image, said camera being rotatable about its optical axis and repositionable at predetermined distances from the vertical axis of said projection chamber, said camera including a plurality of sets of interchangeable mounts, each of said sets having different stand-off lengths.

* * * * *